(12) United States Patent
Wei

(10) Patent No.: US 7,370,692 B2
(45) Date of Patent: May 13, 2008

(54) HEAT DISSIPATING STRUCTURE HAVING DIFFERENT COMPACTNESS

(76) Inventor: Wen-Chen Wei, P.O. Box No. 6-57, Junghe, Taipei 235 (TW)

( * ) Notice: Subject to any disclaimer, the term of this patent is extended or adjusted under 35 U.S.C. 154(b) by 37 days.

(21) Appl. No.: 11/406,304

(22) Filed: Apr. 19, 2006

(65) Prior Publication Data

US 2007/0246190 A1    Oct. 25, 2007

(51) Int. Cl.
*F28F 7/00* (2006.01)
*F25B 7/00* (2006.01)

(52) U.S. Cl. .................. 165/80.3; 165/78; 165/80.1; 165/185

(58) Field of Classification Search .............. 165/78, 165/80.3, 185; 257/720, 722; 361/679–703
See application file for complete search history.

(56) References Cited

U.S. PATENT DOCUMENTS

| | | | | |
|---|---|---|---|---|
| 6,104,609 A * | 8/2000 | Chen | ........................... | 361/695 |
| 6,386,275 B1 * | 5/2002 | Kuo et al. | ................... | 165/80.3 |
| 6,449,160 B1 * | 9/2002 | Tsai | ............................ | 361/709 |
| 6,474,407 B1 * | 11/2002 | Chang et al. | ............... | 165/80.3 |
| 6,607,028 B1 * | 8/2003 | Wang et al. | ................. | 165/185 |
| 6,644,397 B1 * | 11/2003 | Shen | ........................... | 165/185 |
| 6,657,865 B1 * | 12/2003 | Tseng et al. | ................ | 361/709 |
| 6,672,379 B1 * | 1/2004 | Lin et al. | .................... | 165/185 |
| 6,754,079 B1 * | 6/2004 | Chang | ........................ | 361/709 |
| 6,765,799 B1 * | 7/2004 | Huang | ........................ | 361/709 |
| 6,789,609 B2 * | 9/2004 | Tsai et al. | ..................... | 165/78 |
| 6,880,621 B2 * | 4/2005 | Wang | ......................... | 165/80.3 |
| 6,912,128 B2 * | 6/2005 | Bird et al. | ................... | 361/695 |
| 6,995,981 B2 * | 2/2006 | Huang et al. | ............... | 361/703 |
| 7,025,122 B2 * | 4/2006 | You-Tien | .................... | 165/80.3 |
| 7,165,601 B1 * | 1/2007 | Hashimoto | ................... | 165/78 |
| 7,180,740 B2 * | 2/2007 | Li et al. | ...................... | 361/697 |
| 2003/0030980 A1 * | 2/2003 | Bird et al. | ................... | 361/694 |
| 2004/0159421 A1 * | 8/2004 | Wang | ......................... | 165/80.3 |

* cited by examiner

*Primary Examiner*—Frantz Jules
*Assistant Examiner*—Joseph Corrigan
(74) *Attorney, Agent, or Firm*—Troxell Law Office, PLLC

(57) ABSTRACT

A heat dissipating structure having different compactness assembled from a plurality of small heat dissipating fins, thereby forming heat dissipation areas having different spacing. The heat dissipating fins are stamp formed from single strips, and spacing of each of the heat dissipating fins is predetermined when assembling to constitute the structure. The heat dissipating fins are completed from a single stamping, and can be assembled to form heat dissipation areas of different spacing to accommodate a cool air flow being fanned from different oriented fans, thereby reducing obstruction and disturbance of the air flow and rapidly and smoothly guiding the air flow to other heat dissipating fins. Moreover, the heat dissipating structure enlarges area of heat circulation, thereby augmenting speed of heat diffusion, improving heat dissipation effect on heat emitting from computer electronic components, and enhancing functionality of the fan.

1 Claim, 5 Drawing Sheets

HEAT DISSIPATING STRUCTURE HAVING DIFFERENT COMPACTNESS

BACKGROUND OF THE INVENTION (a) Field of the Invention

The present invention relates to a heat dissipating fin structure having different compactness, which uses an assembly of a plurality of small heat dissipating fins to form heat dissipation areas of different spacing that can be arranged to match the direction of air flow being fanned from a fan disposed in various different orientations, thereby improving temperature lowering and heat dissipation functionality for computer electronic components.

(b) Description of the Prior Art

Because a large quantity of heat is produced by electronic components when running at high speed, thus, in general, heat dissipating fins are additionally installed on the computer electronic components in order to prevent the accumulation of heat and avoid overheating and subsequent damage to the electronic components, which would further affect operating safety of the computer, Moreover, a forced air convection from a fan is used to augment heat conduction of the heat dissipating fins, thereby lowering the high temperature of the computer electronic components and dissipating heat produced therefrom, thus maintaining stability of the electronic components. However, a general heat dissipating device sold in the present market, as shown in FIG. 1, is primarily structured to include a fan (2) additionally installed in an appropriate space at a side of heat dissipating fins (1). The heat dissipating fins (1) are arranged to assume a channel form, and spacings between the adjacent heat dissipating fins (1) form a plurality of hot air outlets (3). When the heat dissipating device is installed on a surface of heating electronic components, and when the fan (2) is running, cool air is blown towards air inlets (4) and guided into the heat dissipating fins (1), which dissipate heat energy being conducted upward from the electronic components, thereby achieving heat dissipation functionality. It is well known that when a fan is running the cool air produced is transferred all around, thereby expelling hot air, and prior art heat dissipating fins having equal specifications and dimensions, when mutually joined and assembled, draw in air from the fixedly disposed fan. However, because the air flow from the fan is obstructed by the heat dissipating fins themselves, thus, they are unable to quickly diffuse heat from the electronic components, which results in an aggregation of residual hot air within the heat dissipating device that is detriment to dissipation of heat from the electronic components within a host computer. Hence, in order to increase contact surface area between the heat dissipating fins and heating electronic components, some manufacturers have exerted all efforts in finding a method to reduce spacing between each of the heat dissipating fins. However, assembling the heat dissipating fins too dense together results in a reduction in heat dissipation effect of the heat dissipating fins, along with a corresponding decrease in effectiveness of the heat dissipation functionality of the heat dissipating device. Furthermore, users of high performance computers must tolerate the noise produced by heightened air pressure from the fan when running. Hence, the requirement for quietness cannot be ignored in the pursuit of high performance.

SUMMARY OF THE INVENTION

Hence, in light of the shortcomings in structural design of prior art heat dissipating devices, resulting in many disadvantages in practical use and safety, It can be fully appreciated that the design of the heat dissipating fins Is not only important, but also has a tremendous affect on heat dissipation effectiveness. Hence, the inventor of the present invention attentively researched various methods to resolve the aforementioned shortcomings, which, following continuous research and improvements, culminated in the design of a heat dissipating structure having different compactness that eliminates the shortcomings of prior art and effectively resolves the problem of heat dissipation surface area and heat dissipating fin flow resistance to heat convection.

Stated more specifically, the heat dissipating structure having different compactness of the present invention uses stamping technology to stamp single heat dissipating strips and manufacture extra-thin small heat dissipating fins having a thinness dense to the limitation of current mass-produced stamp forming, thereby enabling the manufacture of more heat dissipating fins from the same surface area of material compared to prior art heat dissipating fins, which, in practical terms, can substantially augment contact area with a heat source. A plurality of the small heat dissipating fins are then joined and assembled to form the heat dissipating structure of the present invention. Moreover, predetermined sparse and dense spacings are formed between the assembled heat dissipating fins to constitute a structure having a configuration ranging from blocks of sparse heat dissipation areas to blocks of dense dissipation areas, or from blocks of dense heat dissipation areas to blocks of sparse dissipation areas or alternate blocks of sparse and dense dissipation areas, which enable rearranging air inlets of the heat dissipating structure so as to match the direction of air flow being fanned from a fan disposed in various different orientations. Furthermore, the heat dissipating fins can be completed from a single stamping. If spacings of a front half section of the assembled heat dissipating structure are relatively large, then relatively wide heat dissipation areas are formed, and the spacings of a rear half section of the heat dissipating structure are relatively dense, thereby forming relatively dense heat dissipation areas. With such a configuration, when a fan is running, cool air blown out by the fan is able to rapidly pass through the relatively wide heat dissipation areas and be smoothly fanned into the relatively dense heat dissipation areas of the rear section, without obstructing the air flow, thereby resolving poor cool air flow resulting from excessive compactness of heat dissipating fins. Furthermore, because surface area of the rear section in contact with the heat source is relatively large, thus, quantity of heat absorbed from heat emitting from electronic components is rapidly dissipated upwards. Moreover, excessive compactness of heat dissipating fins requires increased air pressure from the fan, which directly affects a corresponding increase in fan noise, whereas an excessive sparseness of heat dissipating fins results in the inability to promptly dissipate heat. Design of the present invention using extra-thin small heat dissipating fins assembled to form the heat dissipating structure having different compactness enables a cool air flow to realize full heat exchange within the heat dissipating fins, and prevents obstruction of the air flowing through the heat dissipating structure, thereby resolving the problem of heat dissipation surface area and heat dissipating fin flow resistance to heat convection and the irritation brought about by fan noise.

To enable a further understanding of said objectives and the technological methods of the invention herein, brief description of the drawings is provided below followed by detailed description of the preferred embodiments.

DETAILED DESCRIPTION OF THE PREFERRED EMBODIMENTS

Figure 1:
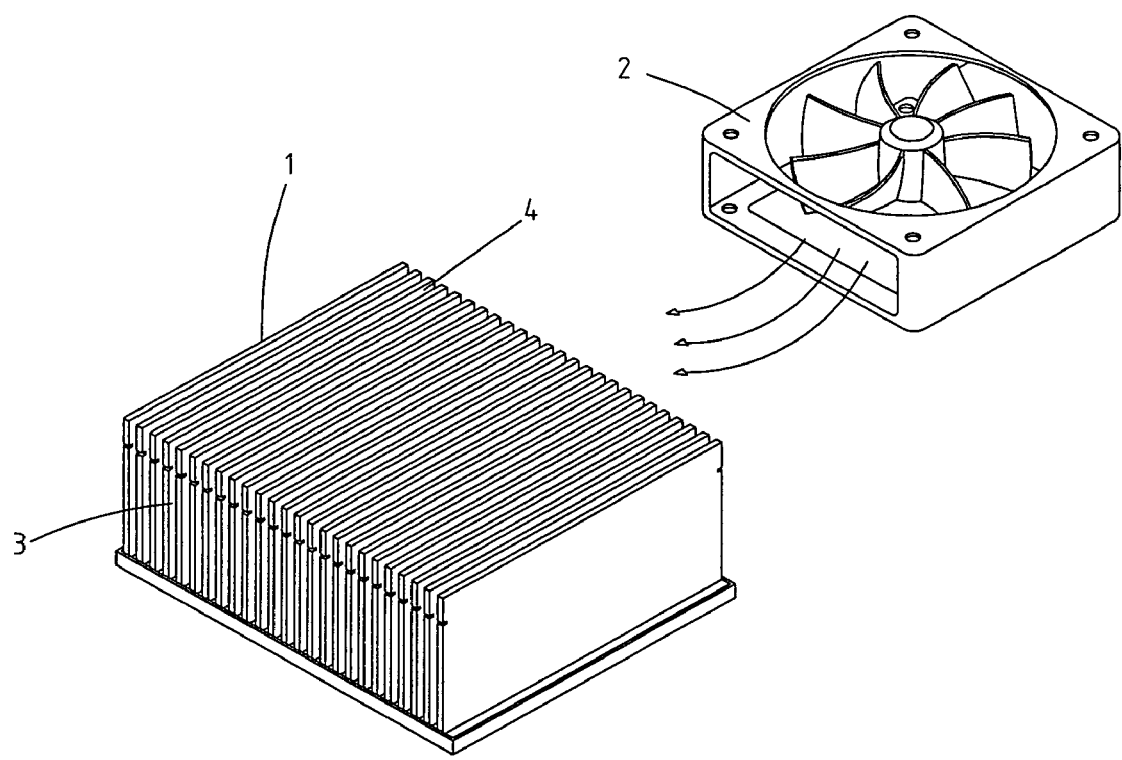
FIG. 1 shows an elevational view of a prior art heat dissipating structure.
Figure 2:
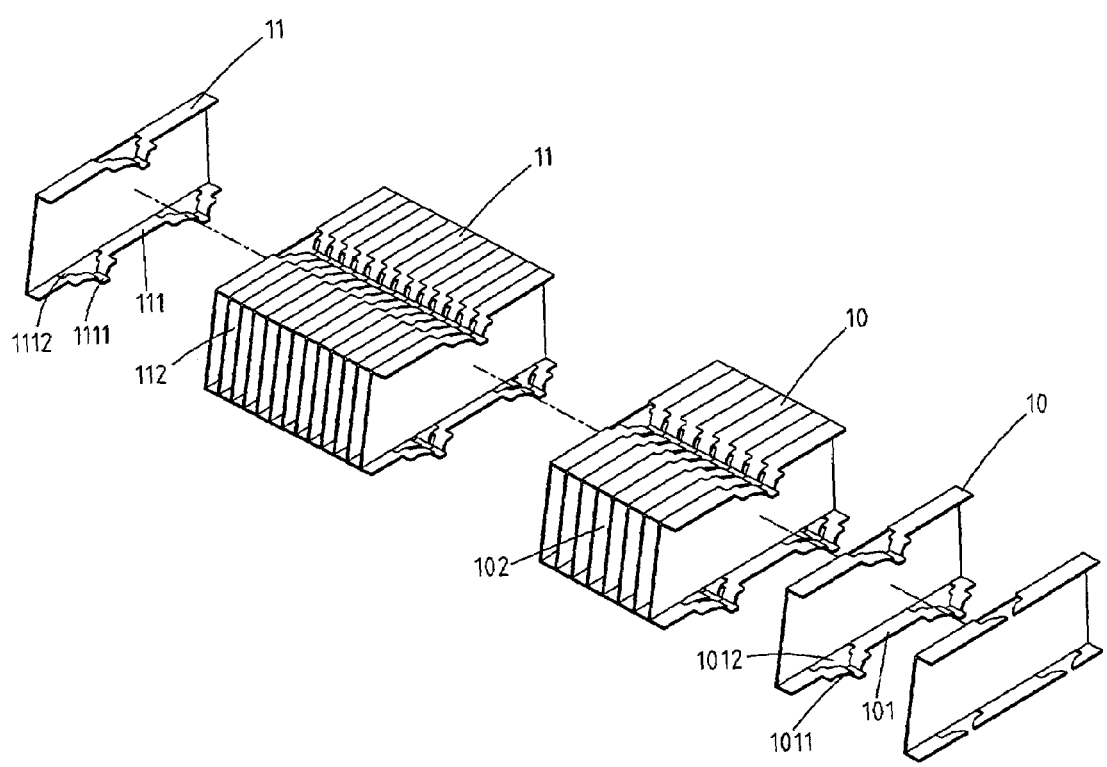
FIG. 2 shows an exploded structural elevational view of an embodiment of the present invention.
Figure 3:
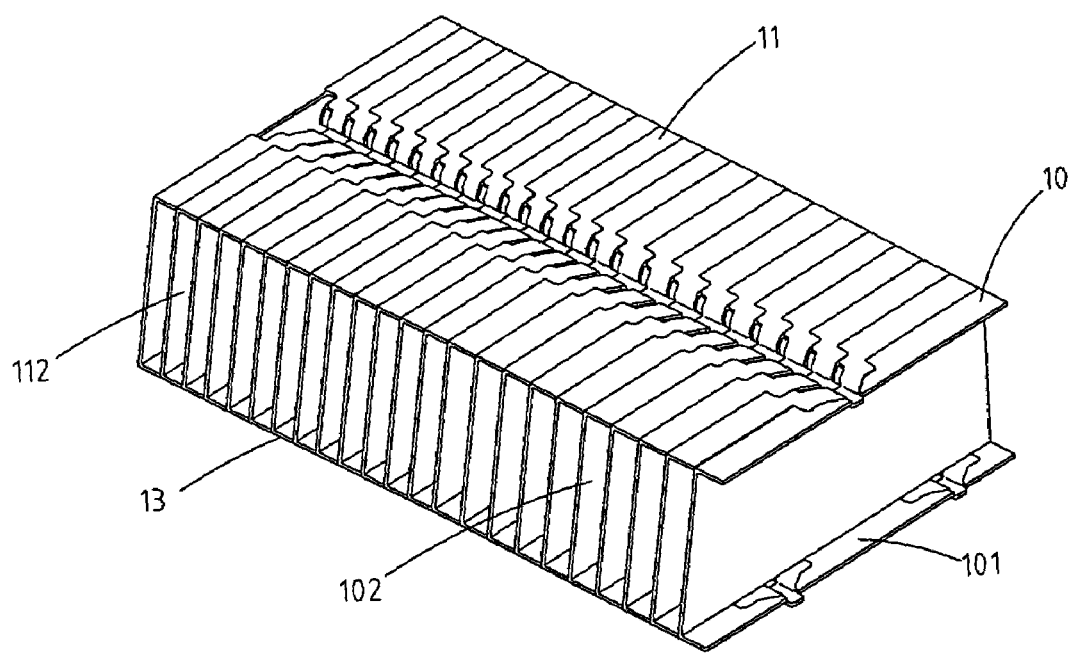
FIG. 3 shows an assembled structural elevational view of the embodiment of the present invention.

Referring to FIGS. 2 and 3, which show an exploded three-dimensional structural view and an assembled structural view of a preferred embodiment of a heat dissipating fin structure having different compactness of the present invention respectively, wherein:

Heat dissipating fins (10) are stamp formed extra-thin short strips, top and bottom end edges of each of which are horizontally bent to form heat conduction wing fins (101). Clasp slots (1011) are formed on the heat conduction wing fins (101), and clasp hooks (1012) respectively extend in the same direction from the clasp slots (1011). A bend in each of the clasp hooks (1012) forms an inverted fastener, which enable assembly of the corresponding front and back heat dissipating fins (10) therewith, thereby allowing a set of the heat dissipating fins (10) to be assembled one strip at a time without resulting in the heat dissipating fins (10) arbitrarily coming apart. The present invention is characterized in the relatively wide heat conduction wing fins (101) located on the heat dissipating fins (10) disposed in a front section of the heat dissipating structure and the relatively large clasp slots (1011) and clasp hooks (1012), which enable formation of relatively larger spacings when assembling the heat conduction wing fins (101), thereby forming relatively wider heat conduction areas (102). Width of heat conduction wing fins (111) formed on heat dissipating fins (11) disposed in a rear section of the heat dissipating structure is less than those of the front section, and clasp slots (1111) and clasp hooks (1112) of the heat conduction wing fins (111) are correspondingly smaller, which enable formation of relatively smaller spacings when assembling the heat conduction wing fins (111), thereby forming relatively dense-packed heat conduction areas (112). Moreover, the heat conduction wing fins (101), (111) of different width can be formed when stamping the heat dissipating fins (10) and the heat dissipating fins (11) respectively, and after the heat dissipating fins (10), (11) are joined and assembled one strip at a time, the heat conduction spacings formed therebetween constitute the sparse heat conduction areas (102) and the dense heat dissipation areas (112).

Figure 4:
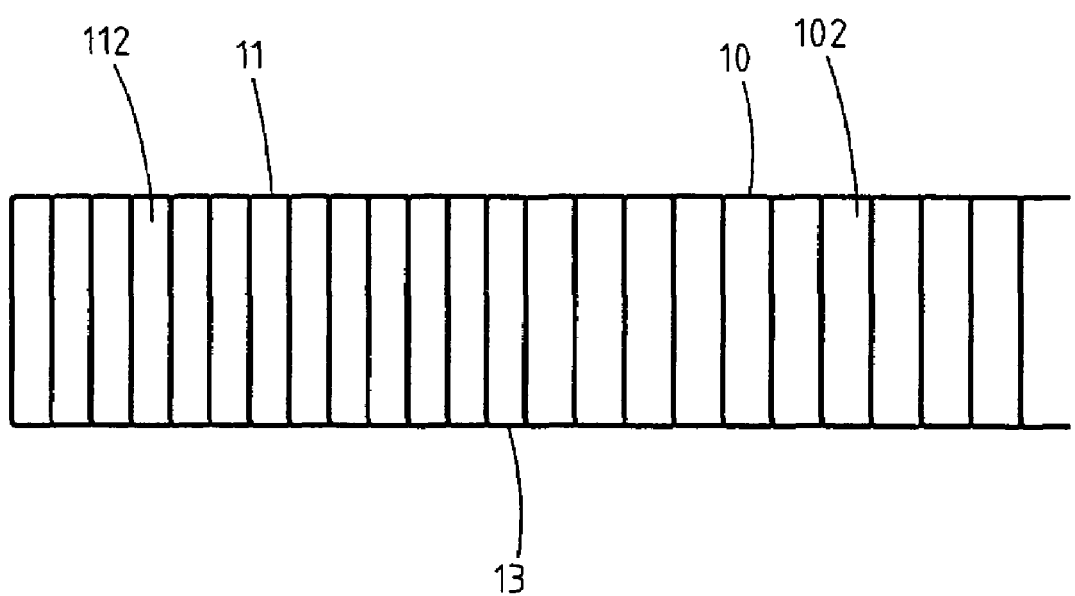
FIG. 4 shows a schematic view of the embodiment of the present invention.

Referring to FIG. 4, which shows a plain view of the embodiment of the present invention, wherein the sparse heat dissipation areas (102) of the front section heat dissipating fins (10) are positioned at a side of an air outlet of a fan. When the fan is running and blowing cool air, a large quantity of the air flow flows into the sparse heat conduction areas (102). Because spacings between the sparse heat conduction areas (102) are relatively large, thus, the air flowing through is not obstructed or disturbed, thereby enabling the air flowing through the front section sparse heat conduction areas (102) to be rapidly and smoothly blown into the dense heat dissipation areas (112) of the rear section heat dissipating fins (11). Hence, the heat dissipating structure of the present invention prevents occurrence of stagnation phenomena, and resolves poor cool air flow resulting from excessive compactness of heat dissipating fins. Furthermore, because of a relatively larger number of the rear section heat dissipating fins (11), thus, surface area of a heat absorbing portion (13) of a bottom portion that makes contact with the heat source of the heating electronic components is relatively large, thereby enabling a quantity of heat absorbed from heat emitting from electronic components to be continuously transmitted towards the front section sparse heat conduction areas (102), where heat exchange with cool air occurs, and the heat is rapidly dispelled upward, achieving optimum heat conduction and dissipation effectiveness.

Figure 5:
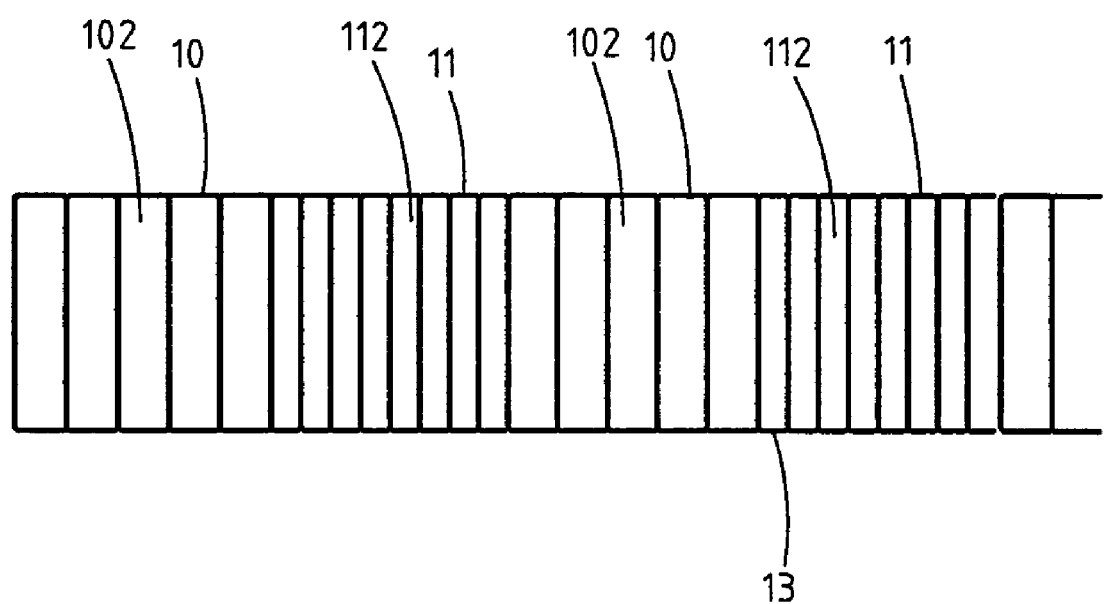
FIG. 5 shows a schematic view of another embodiment of the present invention.

Referring to FIG. 5, which shows another embodiment of the present invention, wherein the heat dissipating structure is formed by respectively assembling the heat dissipating fins (10), (11) in blocks, thereby forming an arrangement of alternate blocks of spacings of different width, that is, a first block consists of a set of the sparse heat conduction areas (102), a second block consists of a set of the dense heat conduction areas (112), a third block consists of a set of the sparse heat conduction areas (102), a fourth block consists of a set of the dense heat conduction areas (102), and so on. The present invention is thus able to be assembled to form blocks of alternate wide and narrow spacings, thereby forming a heat dissipating structure having different spacing of heat dissipating fins, which is able to smoothly guide cool air blowing from the front, and regardless of strength of air speed being drawn in, strong and weak air flows can equally respectively seek a vent and be distributed to each of the sparse heat dissipation areas (102) and the dense heat dissipation areas (112) to circulate therein. Hence, the cool air flow is able to realize full heat exchange within the heat dissipating fins (10), (11), moreover, quantity of heat absorbed by the bottom portion and the heat absorbing portion (13) in contact with the heat source facilitate accelerating upward diffusion of the heat during heat exchange.

Furthermore, worthy of mention is that the present invention not only enables arranging heat dissipation area blocks to appropriately match disposition of the fan, moreover, the heat dissipating fins achieve optimum heat dissipation effect and realize full functionality of the fan without heightening air pressure of the fan, thereby reducing fan noise and resolving the irritation brought about by such noise.

In conclusion, the heat dissipating fin structure having different compactness of the present invention is a practical and complete invention, which is not only provided with originality and superior practicability, moreover, structural configuration and space usage are not found in prior art. Furthermore, stamping technology and design used to structure and assemble the heat dissipating fins (10), (11) clearly improves speed of heat dissipation, and assuredly enhances the heat dissipation function for computer electronic components. The present invention is an advancement and a breakthrough in conventional prior art, and not an obvious simple adaptation, and clearly complies with essential elements as required for a new patent application. Accordingly, a new patent application is proposed herein.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. A heat dissipating fin structure having different compactness, comprising a plurality of small heat dissipating fins, top and bottom end edges of each of which are bent to form heat conduction wing fins, clasp slots are formed on the heat conduction wing fins, and clasp hooks respectively extend in the same direction from the clasp slots, a bend in each of the clasp hooks forms an inverted fastener, which enable assembly of the corresponding front and back heat dissipating fins to form a set of the heat dissipating fins; the heat dissipating fin structure is characterized in that:

the heat dissipating fins are stamp formed from single strips, and spacing of each of the heat dissipating fins is predetermined when assembling, thus, the conduction wing fins located on the heat dissipating fins assembled to form relatively large spacings are relatively wide, and the clasp slots and the clasp hooks of the conduction wing fins are relatively large, thereby forming relatively sparse heat conduction areas when assembling the heat dissipating fins;

width of the conduction wing fins located on the heat dissipating fins assembled to form relatively small spacings is appropriately reduced, and the clasp slots and the clasp hooks of the conduction wing fins are correspondingly smaller, thereby forming relatively dense heat conduction areas when assembling the heat dissipating fins;

the heat dissipating fins are completed from a single stamping, and are assembled to form heat dissipation areas of different spacing, wherein the heat dissipating fins are arranged in a block configuration when assembling comprising blocks of alternate wide and narrow spacings, whereby a first block consists of a set of the sparse heat conduction areas, a second block consists of a set of the dense heat conduction areas, a third block consists of a set of the sparse heat conduction areas, a fourth block consists of a set of the dense heat conduction areas, and so on, thereby forming the heat dissipating structure having a structural configuration of a set of the heat dissipating fins consisting of alternate wide and narrow spacings.

* * * * *